(12) United States Patent
Allred

(10) Patent No.: US 7,058,126 B1
(45) Date of Patent: Jun. 6, 2006

(54) DIGITAL GRAPHAMETRIC EQUALIZER

(75) Inventor: Rustin W. Allred, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/481,851

(22) Filed: Jan. 14, 2000

(51) Int. Cl.
*H03H 7/40* (2006.01)

(52) U.S. Cl. ..................... 375/232; 375/229; 375/233; 708/300; 333/28 R

(58) Field of Classification Search ............... 375/232, 375/229, 233, 230, 231, 234, 235; 708/300, 708/320; 333/28 R; 345/156
See application file for complete search history.

(56) References Cited

U.S. PATENT DOCUMENTS

| 5,541,866 | A |   | 7/1996  | Sato et al. |         |
|-----------|---|---|---------|-------------|---------|
| 5,687,104 | A | * | 11/1997 | Lane et al. | 708/300 |
| 5,694,422 | A | * | 12/1997 | Kaku et al. | 375/229 |

FOREIGN PATENT DOCUMENTS

EP          0932253 A2       7/1999

OTHER PUBLICATIONS

Montuschi P et al. "Division unit with Newton-Raphson approximation and digit-by-digit refinement of the quotient". IEE Proceedings: Computers and Digital Techinques, IEE, GB, vol. 141, No. 6, Nov. 1, 1994, pp. 317-324, XP006001617 ISSN: 1350-2387 * paragraph '02.11 *.

* cited by examiner

*Primary Examiner*—Khai Tran
*Assistant Examiner*—Edith Chang
(74) *Attorney, Agent, or Firm*—W. James Brady; Frederick J. Telecky, Jr.

(57) ABSTRACT

A graphametric equalizer has graphic and parametric equalization capabilities within a single non-redundant system. A translation function capability converts user selected inputs for center frequency, bandwidth and gain into allpass filter parameters to realize an allpass filter-based equalization filter structure capable of performing graphic and/or parametric equalization on-the-fly. The graphametric equalizer has a softening function capability to time user inputs and increment filter parameters gracefully such that the graphametric equalizer can be recharacterized with new filter parameters on-the-fly without incurring undesirable audible artifacts.

19 Claims, 2 Drawing Sheets

DIGITAL GRAPHAMETRIC EQUALIZER

BACKGROUND OF THE INVENTION

1. Field of the Invention

This invention relates generally to audio equalizers, and more particularly to a graphametric equalizer having characteristics of both graphic equalizers and parametric equalizers contained within a single device.

2. Description of the Prior Art

Audio equalizers are well known in the art. Two well known types of audio equalizers include graphic equalizers and parametric equalizers. Historically, graphic equalizers and parametric equalizers have been considered separate entities; a system designer chooses the type of equalizer that best suits the system needs. Graphic equalizers have a fixed number of filters having fixed center frequencies and bandwidths and adjustable gains. The user is able to adjust these gains for the preferred listening experience. Parametric equalizers, on the other hand, typically have a fixed number of filters wherein each filter has a fixed gain, bandwidth and center frequency. Parametric equalizers are typically used to resolve a specific problem such as undesirable variations in frequency characteristics associated with certain loudspeakers. Parametric equalizers, for example, allow implementation of the filters solely necessary to eliminate or correct such problems.

Application of allpass filter structures to accommodate equalization processes is also well known in the art. FIG. 1, for example, depicts a well known filter structure that can be used to implement second-order equalization filters where $A(z)$ is a second-order allpass filter and k is the peak gain of the filter. The second-order allpass filter $A(z)$ depicted in FIG. 1 further has the form illustrated in FIG. 2. Useful properties of the filter structures shown in FIGS. 1 and 2, such as the relationships that exist between particular parameters and coefficients, are also well known. Boost filters, for example, are known to exhibit the relationships between $\beta$ and the bandwidth $\Omega$ shown in equation 1 and between $\alpha$ and the center frequency $\omega_0$ shown in equation 2 below when using such filter structures. Further, cut filters are known to exhibit the relationships between $\beta$, the bandwidth $\Omega$ and the gain k shown in equation 3 below when using such filter structures.

$$\beta = [\tan(\Omega/2) - 1]/[\tan(\Omega/2) + 1] \quad (1)$$

$$\alpha = -\cos(\omega_0) \quad (2)$$

$$\beta = [\tan(\Omega/2) - k]/[\tan(\Omega/2) + k] \quad (3)$$

The filter structures shown in FIGS. 1 and 2 have been used by some skilled the art to formulate parametric equalizers and graphic equalizers. Combining features of both parametric and graphic equalizers into a single system to efficiently and reliably accommodate parametric equalization, graphic equalization and other filtering functions that have historically been unavailable, difficult to accomplish, or otherwise of poor quality is a desirable concept. McGrath, D.S., *A New Approach to Digital Audio Equalization*, 97th AES, November, 1994 discloses however, combining a graphical user interface to a long finite impulse response (FIR) filter equalizer to give some of the benefits of a parametric equalizer with the controllability of a graphic equalizer. McGrath also states that his approach can be accomplished via infinite impulse response (IIR) filters, but gives no details as to how such a structure could be formulated. Further, McGrath does not address issues associated with near real time changes in equalization nor a complete combination of graphic and parametric equalization to accommodate applications that can only be accomplished with such structures.

In view of the foregoing, it would be desirable to have a true combination of graphic and parametric (graphametric) equalizers in a single system without redundant resources to accommodate near real time adjustable parametric equalization among other things.

SUMMARY OF THE INVENTION

The present invention is directed to a graphametric equalizer that combines graphic equalization and parametric equalization features in a single structure without redundant resources. One embodiment of the graphametric equalizer includes an input function capable of accepting user inputs associated with center frequency, bandwidth and gain. The user inputs are passed through a translation function to convert center frequency, bandwidth and gain into filter parameters ($\alpha$, $\beta$, k) via equations 1–3 presented above. A general purpose processor such as a DSP, microprocessor, or micro-controller could be coupled with switches, shaft encoders, or a keyboard to perform the foregoing input and translation functions. The present inventive graphametric equalizer provides equalization without undesirable artifacts by timing the user inputs and incrementing the filter parameters via a softening function such that the parameters can be applied in the filter structure without audible artifacts such as pops, clicks or other undesirable sounds. The softening function provides for small linear (in contradistinction to logarithmic) incremental gain (k) changes in gain (linear) space on the order of about 0.05 to about 0.06 or less most preferably no more than once per 64 samples in order to prevent artifacts when using a sample rate of 44.1 kHz. The filtering function includes multiple allpass-based filters such as illustrated in FIGS. 1 and 2 combined into a structure suitable for processing the input signal(s). Although a general purpose processor such as a DSP, microprocessor, or micro-controller could be coupled with switches, shaft encoders, or a keyboard to perform all of the above functions, the softening and filtering functions could just as well be provided via an audio processor such as a member of the TAS3xxx family of devices commercially available from Texas Instruments Incorporated having a place of business in Dallas, Tex.

As used herein, the following words have the following meanings. The words "algorithmic software" mean an algorithmic program used to direct the processing of data by a computer or data processing device. The words "data processing device" as used herein refer to a CPU, DSP, microprocessor, micro-controller, or other like device and an interface system. The interface system provides access to the data processing device such that data could be entered and processed by the data processing device. The words "discrete data" as used herein are interchangeable with "digitized data" and "digitized data" as used herein means data which are stored in the form of singularly isolated, discontinuous data or digits.

Thus, a structure for a graphmetric equalizer according to one preferred embodiment will comprise:

a plurality of equalizing filters spanning a predetermined audio bandwidth;

a data processor;

a data input device in communication with the data processor;

a translation function algorithmic software directing the data processor;

a softening function algorithmic software directing the data processor; and a data storage unit, wherein discrete center frequency data, discrete bandwidth data and discrete gain data is stored and supplied to the data processor such that the data processor, directed by the translation function algorithmic software, can automatically determine filter parameters using algorithmically defined relationships among the discrete center frequency data, discrete bandwidth data and discrete gain data such that the plurality of equalizing filters can be recharacterized by the filter parameters, and further wherein discrete timing data and discrete incrementing data is stored and supplied to the data processor such that the data processor, directed by the softening function algorithmic software, can automatically determine gain incrementing parameters and timing parameters such that the plurality of equalizing filters can be recharacterized substantially without audible artifacts.

In one aspect of the invention, a combination of graphic and parametric equalizers is contained in a single system without redundant resources.

In another aspect of the invention, a graphametric equalizer further advances that state of the art associated with digital equalizers by utilizing a simple method for approximating [tan(x)−y]/[tan(x)+y] to realize graphametric equalization.

In yet another aspect of the invention, a well known filtering structure is expanded to implement graphametric equalization.

In still another aspect of the invention, a graphametric equalizer is applied to formulate a graphic equalizer having adjustable center frequencies and bandwidths.

In another aspect of the invention, a graphametric equalizer is applied to formulate a parametric equalizer capable of near real time adjustable parametric equalization.

In yet another aspect of the invention, a graphametric equalizer is formulated to accommodate equalization morphing (changing the equalization filters gracefully while in operation).

In still another aspect of the invention, a graphametric equalizer is formulated to accommodate its application to simple, moveable-corner frequency bass and treble controls.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
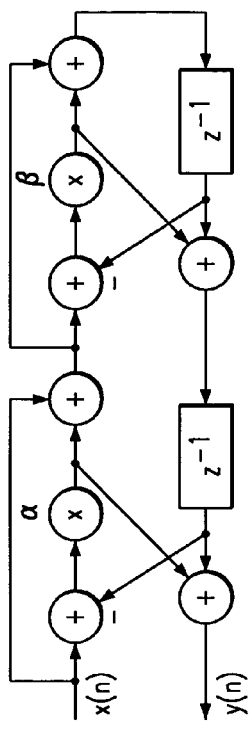
FIG. 1 is a simplified schematic diagram illustrating a well known allpass filter-based equalization filter structure.
Figure 2:
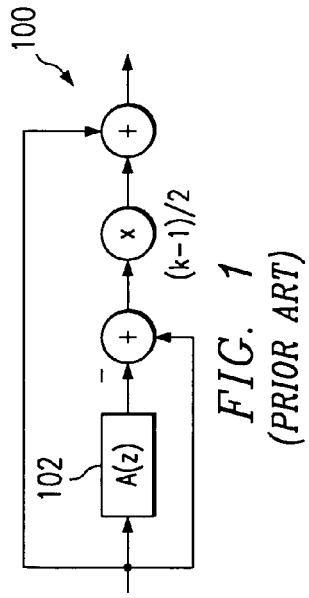
FIG. 2 is a simplified schematic diagram illustrating a well known second-order allpass filter.

FIG. 1 is a simplified schematic diagram illustrating a well known allpass filter-based equalization filter structure 100. Zolzer, U. and Boltze, T., *Parametric Digital Filter Structures*, 99$^{th}$ AES Convention, October, 1995 discloses implementation of second-order equalization filters via the filter structure 100, where A(z) is a second-order allpass filter 102 and k is the peak gain of the filter structure 100. Second-order allpass filters are also well known and can be formulated, for example, using the form illustrated in FIG. 2. Particular relationships between the parameters and the coefficients associated with the allpass filter-based equalization filter structure 100 integrating the second-order allpass filter shown in FIG. 2 exhibit useful properties. Some of these useful properties are exemplified by the equations (1)–(3) expressed herein above and are repeated below with additional supporting information to further clarify the contributions of the present invention. The following equations portray the relationships between the above referenced parameters and the coefficients, also depicted in FIGS. 1 and 2, when the structure of FIG. 1 is configured as a boost filter (filter having a gain greater than unity). The bandwidth, Ω, affects only β and the center frequency, ω$_0$, affects only a in the case of boost filters.

$$\beta = [\tan(\Omega/2) - 1]/[\tan(\Omega/2) + 1] \quad (1)$$

$$\alpha = -\cos(\omega_0) \quad (2)$$

Further, the gain, k, is applied directly to the filter structure 100 with only a small amount of arithmetic, (k−1)/2, as shown in FIG. 1.

The β parameter also takes on a dependency with the gain, k, as expressed by equation (3) below, when the filter structure 100 is formulated as a cut filter (gain less than unity).

$$\beta = [\tan(\Omega/2) - k]/[\tan(\Omega/2) + k] \quad (3)$$

Figure 3:
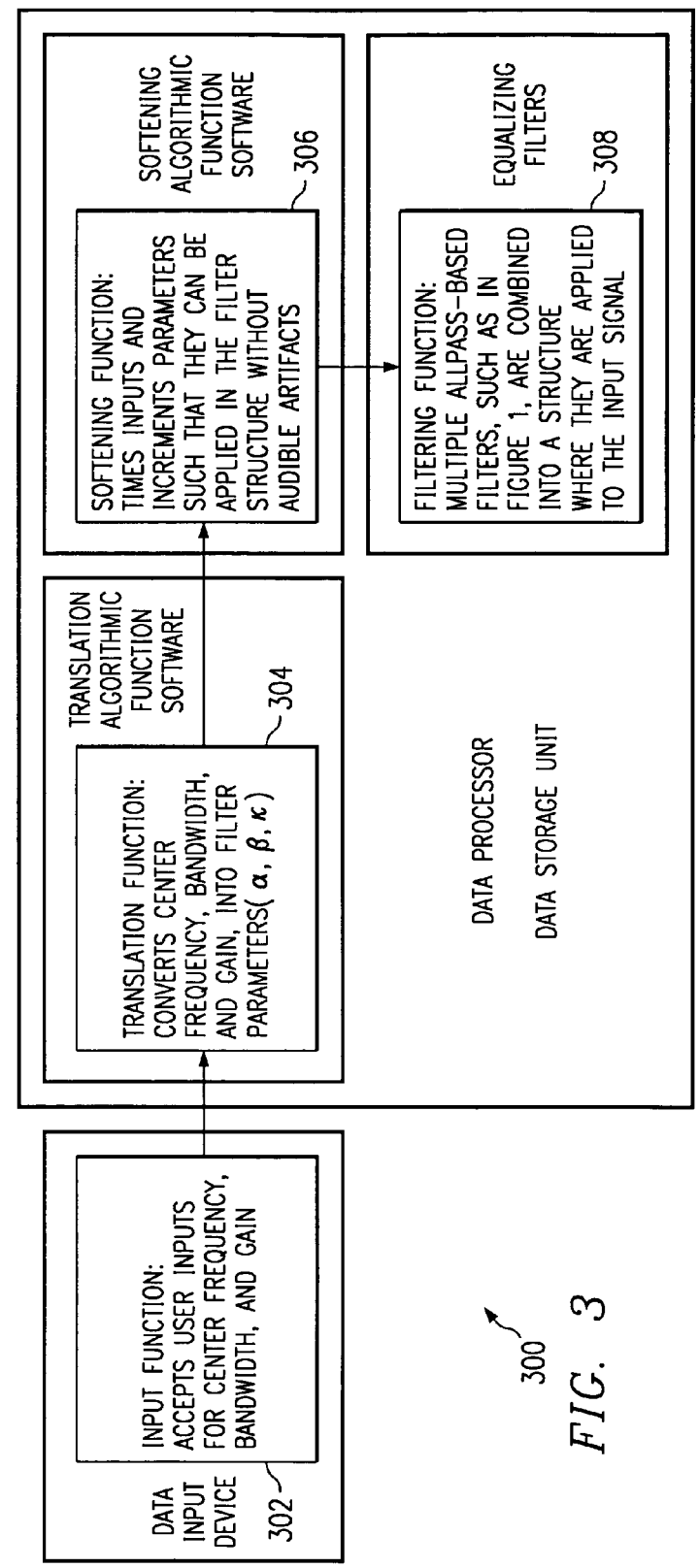
FIG. 3 is a block diagram illustrating a general graphametric equalizer structure according to one embodiment of the present invention.

FIG. 3 is a block diagram illustrating a general graphametric equalizer structure 300 according to one embodiment of the present invention. Prior work has exploited the filter structure 100 for use to accomplish either parametric equalization or graphic equalization, as stated herein above. The present invention however, described in detail below, uses the allpass filter-based equalization filter structure 100 to formulate a unitary graphametric equalizer 300 capable of selectively accomplishing both parametric equalization and graphic equalization without the necessity for redundant resources. Some user input functionality, as depicted in block 302, is anticipated to fully exploit the capabilities of the graphametric equalizer 300. The user inputs 302, including center frequency, bandwidth and gain data, for example, could be provided by a general purpose processor such as a DSP, microprocessor, or micro-controller coupled with switches, shaft encoders, or a keyboard, among other things.

The user inputs 302 are translated, as shown in block 304, using the equations (1)–(3) and other relationships expressed above to generate the requisite filter parameters ($\alpha$, $\beta$, k).

Graphametric equalization most preferably provides equalization functionality without undesirable artifacts such as audible pops, clicks, or other undesirable sounds. The elimination and/or reduction of artifacts is accomplished via a softening function as depicted in block 306. The softening function 306 is used to time and increment the filter parameters ($\alpha$, $\beta$, k) in such a way that artifacts are not noticeable to the human ear. Most preferably, the gain k is changed in small linear increments of about 0.05–0.06 or even less in gain space as contrasted with linear increments in dB space. The foregoing described incrementing preferably takes place no more than once for every 64 samples with a sample rate of 44.1 kHz. A more detailed discussion of the above referenced softening function 306 can be found in U.S. patent application Ser. No. 09/401,422, entitled Digital Graphic Equalizer Control System and Method, incorporated by reference herein in its entirety.

The actual filtering function as shown in block 308 receives the input parameters and applies the requisite filters to the input signal(s). The filtering function 308 can be accomplished using multiple allpass-based filters, such as illustrated in FIG. 1 among others, and combined into a structure where they are applied to the input signal(s).

As stated above, there are many possible realizations for the general graphametric equalizer structure 300 depicted in FIG. 3. A general purpose processor such as a DSP, microprocessor, or micro-controller could be coupled with switches, shaft encoders, or a keyboard to perform all of the functions 302, 304, 306, 308. Further, the input functions 302 and translation function 304 could be provided by a processor with attached input capabilities while the softening function 306 and the filtering function 308 are provided by an audio processor such as a member of the TAS3xxx family of devices commercially available from Texas Instruments Incorporated.

The ability to vary the gain k in small increments necessary to accommodate graphametric equalization is however problematic since cut filters necessarily form a portion of the graphametric equalizer 300. Variable gain k is problematic to graphametric equalization since, as seen in equation (3), $\beta$ has a dependency on the gain, k. While this dependency poses no problem in systems having both trigonometric functions and division capability, it can be complicated to deal with otherwise. Where only division is available, the value of the tangent function can be downloaded as a predetermined filter parameter and computed as the gain k changes. The $\beta$ parameter can then be determined using equation (4) below.

$$\beta = [\Phi - k]/[\Phi + k]; \quad (4)$$

where $\Phi$ is the tangent of half the bandwidth, a predetermined constant for every value of bandwidth. If division capability is not supported by the architecture, piecewise linearization methods can be used to determine the $\beta$ parameter where the bandwidth and gains are known in advance or will be chosen from a small set of possible values. A fully flexible graphametric equalizer structure however, requires the ability to download $\alpha$ and $\beta$ parameters, to set the center frequency and bandwidth respectively, and to vary the gain as needed. Therefore, it is necessary to be able to compute the $\beta$ parameter using equation (4) in near real time (assuming that $\Phi$ can be downloaded). A method according to one embodiment of the present invention discussed herein below, generates the requisite $\beta$ parameters to formulate a fully flexible graphametric equalizer structure 300, even when division capability is not supported by the available architecture.

The present inventor has shown that one process which forms an improved reciprocal estimate can be collapsed into a single formula expressed as:

$$1/x \approx (1/s) * 2^{-n-2} - r * 2^{-2n-1} + 2^{-n-1}; \text{ where}$$

s is a scaling parameter that will ordinarily have a value between 0.5 and 0.6 and is a constant for each application. Therefore the inverse of s can be tabled and applied to avoid computation of its reciprocal. The value of n is represented by the MSD (most significant digit) of the number x, and $r=x-2^n$. Consider for example, a binary word represented by $x=01011001$. The MSD of x is then determined by counting from zero (from the least significant bit on the right) until the MSD (the location of the first '1' digit of x counting from the left) is reached. The value of n represented by the MSD of the number 01011001 is then 6. U.S. patent application Ser. No. 09/192,981, filed Nov. 16, 1998 by Allred, entitled Digital Signal Processing Circuits, Systems, And Methods Implementing Approximations For Logarithm And Inverse Logarithm, sets forth details of the specific methodology used to determine the MSD. The '981 patent application is assigned to Texas Instruments Incorporated, the assignee of the present invention, and is incorporated by reference herein. A fixed value for s in the range of 0.54 to 0.585 was found to improve the accuracy of equation (4) beyond that achievable using piecewise linearization methods. Equation (4) can thus be computed by multiplying its numerator by the reciprocal estimate of its denominator determined via equation (5).

Although the foregoing method is advantageous in terms of accuracy and computational speed, the accuracy of equation (5) has been found to be inadequate in two regions. The first region is the boost region where k>1 and equation (1) is being applied. It is not necessary to use equation (5) in this region however since equation (1) is constant for every bandwidth, regardless of the gain. The value of $\beta$ for the boost region can therefore simply be downloaded. The second region is the region where the argument of the tangent is very small. Analysis shows that, if $\tan(\Omega/2)=\tan(\pi BW/F_s)<<1$, equation (3) can be approximated as:

$$\beta \approx \tan(\pi BW/F_s)/\log_2(3) \cdot k; \text{ where}$$

the inverse of the $\log_2(3)$ is a constant that can be tabled or approximated using a canonical sign digit (CSD) representation. In view of the above, the only inverse needed is that of gain k, which can be approximated using the technique of equation (5). Equation (6) has been found to have sufficient accuracy for computing $\beta$ in the region where $\tan(\Omega/2) \leq 0.0625$, which is adequate to cover the region where the equation (4)-based approximation is too inaccurate.

Figure 4:
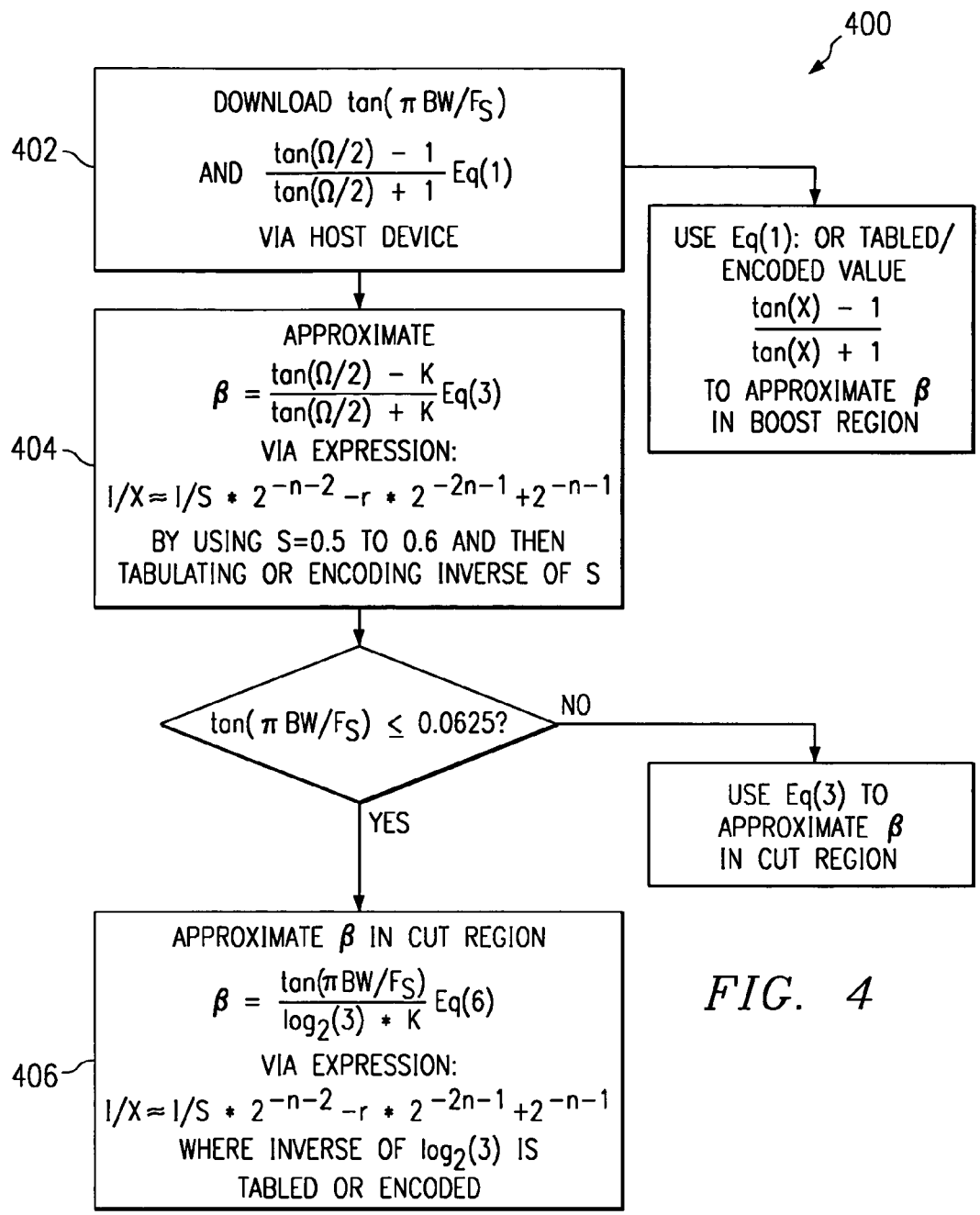
FIG. 4 is a flowchart illustrating the methodology for calculating the β parameter for the second-order allpass filter depicted in Figure in near real time according to one embodiment of the present invention such that a fully flexible graphametric equalizer can be realized.

FIG. 4 illustrates a flowchart 400 summarizing the methodology for calculating the $\beta$ parameter in near real time according to one embodiment of the present invention such that a fully flexible graphametric equalizer 300 can be realized in accordance with the structures and techniques discussed herein above. In summation, the correct $\beta$ parameter can be determined by first downloading both $\tan(\pi BW/F_s)$ and the $\beta$ parameter from equation (1) from the host device as shown in block 402. $\tan(\pi BW/F_s)$ is downloaded since it is used in the approximations for $\beta$ in the cut region discussed above with reference to equation (3). The $\beta$ parameter from equation (1) can also be approximated simply to generate a more accurate value, but for the small cost of the additional download that is a tradeoff between accuracy and cost. Next, approximate equation (3) in the cut region by first using equation (5) to approximate the reciprocal of the denominator and by then multiplying that approximation by the numerator as shown in block 404. Finally, determine if $\tan(\pi BW/F_s)<0.0625$; and if it is, then use equation (6) to approximate β by first using equation (5) to approximate the reciprocal of k which is then multiplied by the numerator of equation (6) along with the tabled or encoded value of the reciprocal of $\log_2(3)$ as shown in block 406. The foregoing methodology is believed to be a significant advancement in the state of the art since it provides a way to realize a fully flexible graphametric equalizer structure 300.

Applications of the Graphametric EQ Structure

Parametric EQ

The general graphametric equalizer (EQ) structure 300 illustrated in FIG. 3 can be used exclusively to accomplish parametric equalization exclusively. When used as a parametric equalizer, the requisite filter parameters (α, β, k) are received by the filtering function 308 and implemented in a straightforward fashion well known in the art.

Graphic EQ

Graphic equalization can also be exclusively accomplished using the graphametric EQ structure 300. When used as a graphic equalizer, the α values are fixed according to the predetermined center frequencies chosen. The β values must change along with the gain k, in the usual case where the graphic EQ includes cut filters, as discussed above. The approximation methods presented herein above are believed to significantly advance the state of the EQ art by providing a more efficient way to accommodate the requisite changes in β to accomplish graphic equalization.

Graphametric EQ

As discussed above, the graphametric equalizer structure 300 presents a more flexible type of equalizer than either graphic or parametric equalizers presently known in the art. Graphametric equalization allows a user to choose the center frequencies and bandwidths on-the-go or in near real time while allowing gains to be adjusted as in a usual graphic equalizer. Thus, graphametric EQ can also be viewed as gain-adjustable parametric EQ. The graphametric EQ can therefore accomplish functions not achievable or not efficiently achievable using graphic or parametric Equalizers alone or in combination. Suppose, for example, that a speaker requires a correction for a specific signal amplitude at particular frequencies. A parametric EQ is designed to accomplish such a task. An additional set of EQ filters ordinarily must be stored and downloaded as needed however, to make the bass or treble response a little "hotter." Muting would likely also be required to avoid artifacts. A graphametric EQ structure can however, accommodate such a task by merely adjusting the gains of the appropriate filters while leaving the other parameters unchanged.

A graphic EQ, on the other hand, might be exactly what is needed for some systems. A stereo system, for example, might contain an ordinary 10-band graphic equalizer. The center frequencies could be fixed, for example, at the frequencies of a piano's C keys (32.7, 65.4, 130.8, 261.6, 523.3, 1046.5, 2093.0, 4186.0 Hertz) with an additional 2 octaves above (8372.0, 16744.0 Hertz) to cover the entire audio band. The Q's (Q=center frequency/bandwidth) of these filters would all be in the range of 2. Many small loudspeakers have very little response below 50 Hertz however. In this case, the lowest band of the graphic equalizer described above either is ineffective, or worse, prone to cause distortion.

Alternatively, the above described stereo system could employ a graphametric equalizer to allow easy adjustment of the center frequencies. The 10 bands could be redistributed uniformly in the range between 50 Hz and 20 kHz, for example; and the Q's could be slightly tightened to more efficiently utilize the aforesaid smaller loudspeakers. The present graphametric equalizer provides a structure capable of realizing such foregoing modifications without requiring a design effort, sophisticated software to calculate coefficients, or a long period of time to accomplish. Instead, the modifications can be made by a user simply dialing in the chosen parameters, which are then simply mapped to values of α and β as discussed herein above.

The present graphametric equalizer therefore provides a user the flexibility necessary to easily map and re-map his graphic equalizer in a desired way. A particular loudspeaker, for example, may have an erratic response in one frequency band, and few or no problems elsewhere. The capabilities of a graphametric equalizer allow the user to bunch several graphic EQ filters in the most important region, and use fewer filters in other areas.

The present graphametric equalizer also provides a user with the tools necessary to accomplish changing the EQ (replacing a particular set of EQ filters with a different set). Ordinarily, when using a parametric EQ for example, EQ morphing is accomplished by first muting the sound, then altering the desired coefficients, and finally un-muting the sound. Other, more expensive methods familiar to those skilled in the art, could also be used to accomplish EQ morphing. EQ morphing is more easily and simply accomplished with the present graphametric equalizer however by simply first setting the gain of the filter to be morphed to zero using the artifact-free techniques discussed herein above. The new α and β parameters are input, and then the filter gain is again adjusted 'softly' to the appropriate level.

Figure 5:
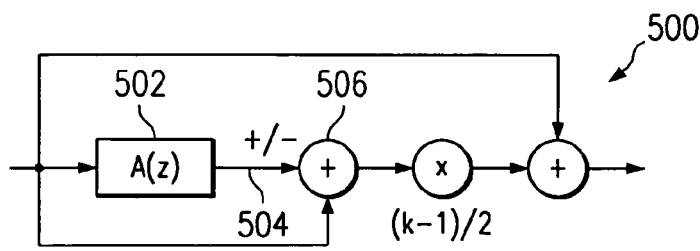
FIG. 5 illustrates a well known structure suitable for implementing first-order shelf filters.

This invention has been described in considerable detail in order to provide those skilled in the equalizer art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. FIG. 5, for example, illustrates a structure 500 that is suitable for implementing first-order shelf filters well known to those skilled in the art. In many applications, shelving filters converge toward 0 dB in the center of the audio band, and toward some finite value at the band edge. The A(z) block 502 in FIG. 5 will have the form expressed by equation (7) below.

$$A(z)=[\beta+z^{-1}]/[1+\beta z^{-1}]; \text{ where} \qquad (7)$$

β is defined as in equations (1) or (3) expressed herein before. The sign of the branch 504 entering the summing node 506 must be positive for low-frequency (typically 20 Hz to a few hundred Hz) shelves and negative for high frequency (typically above 5 kHz) shelves. The structure 500 can be implemented within the general graphametric EQ structure 300 of FIG. 3 to allow moveable-corner bass and treble controls. The sign can be accommodated by downloading a control bit or a multiplicative factor of 1 or −1 while the β parameter can be configured to adjust the corner frequencies of the first order shelf filters. Again, the values of β in the cut region can be approximated using the methods described herein above. Those skilled in the art shall also understand the present invention can also be configured for use with ordinary bell-shaped EQ filters to accommodate graphic equalization in the treble and bass regions. Such an approach can prove useful to prevent driving excessive bass energy into small loudspeakers since, unlike a shelf filter, the low end response rolls off as in a classic bell-shaped filter.

What is claimed is:

1. A graphametric equalizer comprising:
   a plurality of equalizing filters spanning a predetermined audio bandwidth;
   a data processor;
   a data input device in communication with the data processor;
   a translation function algorithmic software directing the data processor;
   a softening function algorithmic software directing the data processor; and
   a data storage unit, wherein discrete center frequency data, discrete bandwidth data and discrete gain data is stored and supplied to the data processor such that the data processor, directed by the translation function algorithmic software, can determine filter parameters using algorithmically defined relationships among the discrete center frequency data, discrete bandwidth data and discrete gain data such that the plurality of equalizing filters can be recharacterized by the filter parameters, and further wherein discrete timing data and discrete incrementing data is stored and supplied to the data processor such that the data processor, directed by the softening function algorithmic software, can determine gain incrementing parameters and timing parameters such that the plurality of equalizing filters can be recharacterized;
   wherein each equalizing filter comprises an allpass filter having a multiplier dependent upon a predetermined bandwidth and a predetermined peak gain for a cut region below 0 dB and further dependent solely upon a predetermined bandwidth for a boost region above 0 dB; and
   wherein the translation function algorithmic software is configured to approximate the allpass filter multiplier in the cut region below 0 dB and comprises the multiplier approximation function:

$\beta \approx \tan(\pi BW/F_s)/\log_2(3) \cdot k$; wherein

β is the allpass filter multiplier, BW is a user selected allpass filter bandwidth, Fs is a user selected sampling frequency, and k is a user selected peak gain of the equalizing filter.

2. A graphametric equalizer comprising:
   a plurality of equalizing filters spanning a predetermined audio bandwidth;
   a data processor;
   a data input device in communication with the data processor;
   a translation function algorithmic software directing the data processor;
   a softening function algorithmic software directing the data processor; and
   a data storage unit, wherein discrete center frequency data, discrete bandwidth data and discrete gain data is stored and supplied to the data processor such that the data processor, directed by the translation function algorithmic software, can determine filter parameters using algorithmically defined relationships among the discrete center frequency data, discrete bandwidth data and discrete gain data such that the plurality of equalizing filters can be recharacterized by the filter parameters, and further wherein discrete timing data and discrete incrementing data is stored and supplied to the data processor such that the data processor, directed by the softening function algorithmic software, can determine gain incrementing parameters and timing parameters such that the plurality of equalizing filters can be recharacterized;
   wherein the translation function algorithmic software is further configured to form a reciprocal estimate for a constant x and comprises the reciprocal estimate function:

$1/x = (1/s)*2^{-n-2} - r*2^{-2n-1} + 2^{-n-1}$; wherein s is a scaling parameter that will ordinarily have a value between about 0.5 and about 0.6 and is a constant, and wherein the value of n is represented by the most significant digit of the constant x, and further wherein $r = x - 2^n$.

3. A digital graphametric equalizer comprising:
   a plurality of equalizing filters spanning a predetermined audio bandwidth, each equalizing filter comprising an allpass filter having a variable multiplier dependent upon a desired bandwidth and a desired peak gain for a cut region below 0 dB and further dependent solely upon the desired bandwidth for a boost region above 0 dB; and
   a translation algorithmic software configured to generate a reciprocal estimate for the desired peak gain k and that comprises the reciprocal estimate function:

$1/k \approx (1/s)*2^{-n-2} - r*2^{-2n-1} + 2^{-n-1}$; wherein s is a scaling parameter that will ordinarily have a value between about 0.5 and about 0.6 and is a constant, and wherein the value of n is represented by the most significant digit of the desired peak gain k, and further wherein $r = k - 2^n$.

4. The digital graphametric equalizer according to claim 3 wherein the translation algorithmic software is further configured to approximate the allpass filter variable multiplier in the cut region below 0 dB and comprises the multiplier approximation function:

$\beta \approx \tan(\pi BW/F_s)/\log_2(3) \cdot k$ for $\tan(\pi BW/F_s) \leq 0.0625$; wherein β is the allpass filter multiplier, BW is a predetermined allpass filter bandwidth, Fs is a sampling frequency, and k is a predetermined peak gain of the equalizing filter.

5. The graphametric equalizer according to claim 3 wherein the translation algorithmic software is further configured to approximate the allpass filter variable multiplier in the cut region below 0 dB and comprises the multiplier approximation function:

$\beta = [\tan(\Omega/2) - 1]/[\tan(\Omega/2) + 1]$ for $\tan(\pi BW/F_s) > 0.0625$; wherein β is the allpass filter multiplier, BW is a predetermined allpass filter bandwidth, Fs is a predetermined sampling frequency, and k is a predetermined peak gain of the equalizing filter.

6. A graphametric equalizer comprising:
a plurality of digital equalizing filters spanning a predetermined audio bandwidth, each equalizing filter comprising an allpass filter having a variable multiplier parameter that is dependent upon a desired bandwidth and a desired peak gain for a cut region below 0 dB and further that is dependent solely upon a desired bandwidth for a boost region above 0 dB;
translating means for translating a desired bandwidth and a desired peak gain and generating the variable multiplier parameter such that the plurality of digital equalizing filters can be recharacterized with a desired multiplier; and
softening means for timing user inputs and incrementing filter parameters such that the plurality of digital equalizing filters can be recharacterized,
wherein the translating means comprises an algorithmic software configured to generate a reciprocal estimate for the desired peak gain k using the relationship:

$1/k \approx (1/s)*2^{-n-2} - r*2^{-2n-1} + 2^{-n-1}$; wherein s is a scaling parameter that will ordinarily have a value between about 0.5 and about 0.6 and is a constant, and wherein the value of n is represented by the most significant digit of the desired peak gain k, and further wherein $r=k-2^n$.

7. The graphametric equalizer according to claim 5 wherein the translating means further comprises an algorithmic software configured to generate the allpass filter variable multiplier parameter in the cut region below 0 dB and comprises the multiplier approximation function:

$\beta \approx \tan(\pi BW/F_s)\log_2(3) \cdot k$ for $\tan(\pi BW/F_s) \leq 0.0625$; wherein β is the allpass filter variable multiplier parameter, BW is a predetermined allpass filter bandwidth, Fs is a predetermined sampling frequency, and k is the peak gain of the equalizing filter.

8. A graphametric equalizer comprising:
a plurality of digital equalizing filters spanning a predetermined audio bandwidth, each equalizing filter comprising an allpass filter having a variable multiplier parameter that is dependent upon a desired bandwidth and a desired peak gain for a cut region below 0 dB and further that is dependent solely upon a desired bandwidth for a boost region above 0 dB;
translating means for translating a desired bandwidth and a desired peak gain and generating the variable multiplier parameter such that the plurality of digital equalizing filters can be recharacterized with a desired multiplier; and
softening means for timing user inputs and incrementing filter parameters such that the plurality of digital equalizing filters can be recharacterized,
wherein the softening means is configured to limit equalizer gain variations to a range of about 0.05 to about 0.06 in linear space no more than once for every 64 samples for a sampling rate of about 44.1 kHz.

9. The graphametric equalizer according to claim 8 wherein the softening means is further configured to limit equalizer parameter variations to no more than a single modification for every 64 input samples for a sampling rate of about 44.1 kHz.

10. A method of digital equalizer control comprising the steps of:
providing an allpass filter-based equalization filter having a variable parameter multiplier;
receiving a user-selected gain and user-selected bandwidth for an allpass filter associated with the equalization filter;
generating a reciprocal estimate for the user-selected gain using the relationship:

$1/k \approx (1/s)*2^{-n-2} - r*2^{-2n-n} + 2^{-n-1}$; wherein s is a scaling parameter that will ordinarily have a value between 0.5 and 0.6 and is a constant, and wherein the value of n is represented by the most significant digit of a desired peak gain k, and further wherein $r=k-2^n$;
translating the user-selected gain and user-selected bandwidth into a desired first multiplier parameter β for the allpass filter via a multiplier approximation function expressed as:

$\beta \approx \tan(\pi BW/F_3)/\log_2(3) \cdot k$ for $\tan(\pi BW/F_s) \leq $ about 0.0625; wherein β is the desired first multiplier for the allpass filter, BW is a predetermined allpass filter bandwidth, Fs is a predetermined sampling frequency, and k is the peak gain of the equalizing filter; and
processing a desired input signal via the allpass filter such that the equalizing filter can achieve a negative gain in a predetermined cut region below 0 dB.

11. The method according to claim 10 further comprising the step of translating the user-selected gain and user-selected bandwidth into the desired second allpass filter multiplier parameter β for the allpass filter via a multiplier approximation function expressed as:

$\beta = [\tan(\Omega/2) - k]/[\tan(\Omega/2) + k]$; wherein

Ω is the user-selected bandwidth, such that the equalizing filter can achieve a negative gain for a desired input signal in the predetermined cut region below 0 dB when $\tan(\pi BW/F_s) > 0.0625$.

12. The method according to claim 10 further comprising the step of receiving a user-selected center frequency for the equalizing filter associated with the allpass filter and translating the user-selected center frequency into a second variable allpass filter multiplier parameter such that the equalizing filter can be realized via a second-order allpass filter.

13. The method according to claim 10 further comprising the step of translating the user-selected bandwidth into a desired allpass filter second multiplier parameter β for the allpass filter via a multiplier approximation function expressed as:

$\beta = [\tan(\Omega/2) - 1]/[\tan(\Omega/2) + 1]$; wherein

Ω is the user-selected bandwidth, such that the equalizing filter can achieve a positive gain for the desired input signal when the input signal is in a predetermined boost region above 0 dB.

14. A method of digital equalizer control comprising the steps of:
providing an allpass filter-based equalization filter;
receiving a user-selected center frequency, user-selected bandwidth and user-selected gain setting;
generating a reciprocal estimate for the user-selected gain setting;
generating a first allpass filter multiplier parameter in a region where $\tan(\Omega/2) \leq $ about 0.0625 based in part upon the reciprocal estimate for the user-selected gain setting, where $\Omega$ is the user-selected bandwidth;

characterizing an allpass filter via the first allpass filter multiplier parameter; and processing a predetermined input signal via the equalization filter to achieve a negative gain in a desired cut region below 0 dB.

15. The method of claim 14 further comprising the steps of:

timing and incrementing the recharacterization of the allpass filter via the first allpass multiplier parameter such that undesirable audible artifacts are substantially reduced.

16. The method of claim 14 further comprising the steps of:

generating a second allpass filter multiplier parameter in the region where $\tan(\Omega/2)$>about 0.0625;

further characterizing second allpass filter via a second filter multiplier parameter; and processing the predetermined input signal via the equalization filter to achieve a negative gain in the desired cut region below 0 dB.

17. The method of claim 16 further comprising the steps of:

timing and incrementing the recharacterization of the allpass filter via the second allpass filter such that undesirable audible artifacts are substantially reduced.

18. The method of claim 14 further comprising the steps of:

generating a third allpass filter multiplier parameter based upon the user-selected center frequency;

further characterizing the allpass filter via the third allpass filter; and processing the predetermined input signal via the equalization filter to achieve a positive gain in a desired boost region above 0 dB.

19. The method of claim 18 further comprising the steps of:

timing and incrementing the recharacterization of the allpass filter via the filter multiplier parameters such that undesirable audible artifacts are substantially reduced.

* * * * *